(12) United States Patent
Wu et al.

(10) Patent No.: US 10,867,947 B2
(45) Date of Patent: Dec. 15, 2020

(54) SEMICONDUCTOR PACKAGES AND METHODS OF MANUFACTURING THE SAME

(71) Applicant: Taiwan Semiconductor Manufacturing Co., Ltd., Hsinchu (TW)

(72) Inventors: Jiun-Yi Wu, Taoyuan (TW); Chen-Hua Yu, Hsinchu (TW); Yu-Min Liang, Taoyuan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 0 days.

(21) Appl. No.: 16/521,601

(22) Filed: Jul. 25, 2019

(65) Prior Publication Data

US 2020/0176405 A1  Jun. 4, 2020

Related U.S. Application Data

(60) Provisional application No. 62/773,144, filed on Nov. 29, 2018.

(51) Int. Cl.
| | |
|---|---|
| *H01L 23/00* | (2006.01) |
| *H01L 23/29* | (2006.01) |
| *H01L 21/56* | (2006.01) |
| *H05K 1/18* | (2006.01) |
| *H01L 23/31* | (2006.01) |
| *H01L 23/538* | (2006.01) |
| *H01L 23/498* | (2006.01) |

(52) U.S. Cl.
CPC ............ *H01L 24/09* (2013.01); *H01L 21/565* (2013.01); *H01L 23/293* (2013.01); *H01L 23/3107* (2013.01); *H01L 23/3128* (2013.01); *H01L 23/49811* (2013.01); *H01L 23/49838* (2013.01); *H01L 23/5386* (2013.01); *H05K 1/181* (2013.01); *H01L 2224/02371* (2013.01)

(58) Field of Classification Search
CPC ... H01L 24/09; H01L 21/565; H01L 23/3107; H01L 23/293; H01L 2224/02371; H05K 1/181
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| | (Continued) | |

*Primary Examiner* — Ahmed N Sefer
(74) *Attorney, Agent, or Firm* — JCIPRNET

(57) ABSTRACT

Semiconductor packages and methods of forming the same are disclosed. One of the semiconductor packages includes a circuit board structure, a first redistribution layer structure, a plurality of first bonding elements, a package structure and a plurality of second bonding elements. The first redistribution layer structure is disposed over and electrically connected to the circuit board structure. The first bonding elements are disposed between and electrically connected to the first redistribution layer structure and the circuit board structure. The package structure is disposed over and electrically connected to the first redistribution layer structure. The second bonding elements are disposed between and electrically connected to the first redistribution layer structure and the package structure.

20 Claims, 11 Drawing Sheets

(56) References Cited

U.S. PATENT DOCUMENTS

| | | | |
|---|---|---|---|
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,368,460 B2 | 6/2016 | Yu et al. | |
| 9,372,206 B2 | 6/2016 | Wu et al. | |
| 9,496,189 B2 | 11/2016 | Yu et al. | |
| 2002/0061665 A1* | 5/2002 | Batinovich | H01L 21/4853 439/71 |
| 2013/0026609 A1* | 1/2013 | Wu | H01L 23/13 257/632 |
| 2014/0217610 A1* | 8/2014 | Jeng | H01L 24/81 257/774 |
| 2015/0069623 A1* | 3/2015 | Tsai | H01L 21/563 257/774 |
| 2015/0348912 A1* | 12/2015 | Su | H01L 21/4842 257/666 |
| 2016/0099231 A1* | 4/2016 | Yang | H01L 23/3171 257/693 |
| 2017/0098634 A1* | 4/2017 | Kumar | H04W 4/80 |
| 2017/0125347 A1* | 5/2017 | Hu | H01L 23/49805 |
| 2017/0256528 A1* | 9/2017 | Lim | H01L 21/78 |
| 2017/0373037 A1* | 12/2017 | Yu | H01L 24/18 |
| 2018/0068983 A1* | 3/2018 | Chang | H01L 21/6835 |

\* cited by examiner

SEMICONDUCTOR PACKAGES AND METHODS OF MANUFACTURING THE SAME

CROSS-REFERENCE TO RELATED APPLICATION

This application claims the priority benefit of U.S. provisional application Ser. No. 62/773,144, filed on Nov. 29, 2018. The entirety of the above-mentioned patent application is hereby incorporated by reference herein and made a part of this specification.

BACKGROUND

Semiconductor packages are used in a variety of electronic applications, such as personal computers, cell phones, digital cameras, and other electronic equipment. In terms of the packaging used for integrated circuit components or semiconductor dies, one or more chip packages are generally bonded to a circuit carrier (e.g., a system board, a printed circuit board, or the like) for electrical connections to other external devices or electronic components.

Recently, high-performance computing (HPC) has become more popular and being widely used in advanced networking and server applications, especially for AI (artificial intelligence) related products that require high data rate, increasing bandwidth and for lowering latency. However, as the package size is getting larger for packages including the HPC component, more challenging issue occur.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1A:
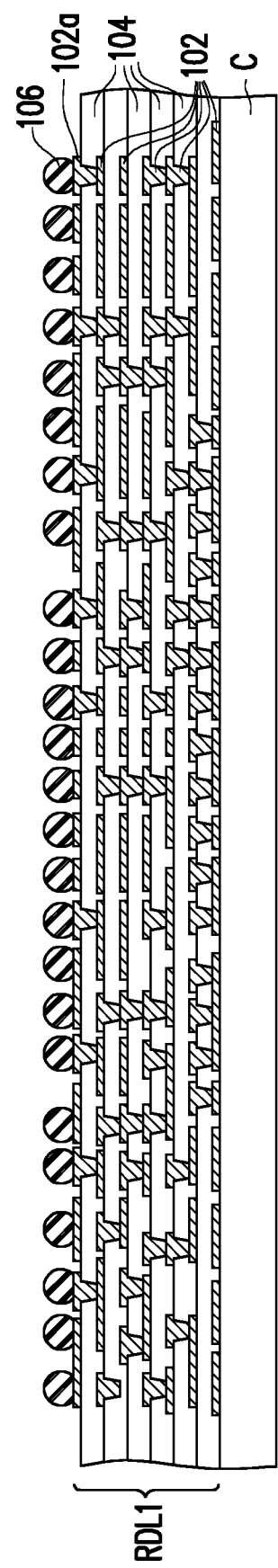
FIG. 1A to FIG. 1I are schematic sectional views of various stages in a method of fabricating a semiconductor package according to some exemplary embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In addition, terms, such as "first," "second," "third," "fourth," and the like, may be used herein for ease of description to describe similar or different element(s) or feature(s) as illustrated in the figures, and may be used interchangeably depending over the order of the presence or the contexts of the description.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1I are schematic sectional views of various stages in a method of fabricating a semiconductor package according to some exemplary embodiments of the present disclosure. Referring to FIG. 1A, a redistribution layer structure RDL1 is formed over a carrier C. In some embodiments, the carrier C may be a glass carrier or any suitable carrier for carrying a semiconductor wafer or a reconstituted wafer for the manufacturing method of the semiconductor package. A shape of the carrier C may be circle, rectangle or other suitable shape. In some embodiments, the redistribution layer structure RDL1 may be a fan-out redistribution layer structure, for example. In some embodiments, the formation of the redistribution layer structure RDL1 may include sequentially forming a plurality of conductive patterns 102, 102a and a plurality of dielectric layers 104, wherein the conductive patterns 102, 102a and the dielectric layers 104 are alternately stacked over the carrier C. In some embodiments, the conductive patterns 102, 102a may be formed by a deposition followed by a photolithography and etching process. In some embodiments, the outermost conductive patterns 102a (also referred to as the exposed conductive patterns 102a or the topmost conductive patterns 102a) are used as conductive terminals, which may include a plurality of conductive pillars and a plurality of under-ball metallurgy (UBM) patterns therebeneath for ball mount. In some embodiments, the outermost conductive patterns 102a may be bonding pads, for example. In some embodiments, the conductive patterns 102, 102a may be formed by an electroplating or an electroless plating. In some embodiments, the conductive patterns 102, 102a include metal, such as aluminum, titanium, copper, nickel, tungsten, and/or alloys thereof. In some embodiments, the dielectric layers 104 are formed by suitable fabrication techniques such as spin-on coating, chemical vapor deposition (CVD), plasma-enhanced chemical vapor deposition (PECVD) or the like. In some embodiments, a thickness of the dielectric layer 104 is in a range of 5 μm to 50 μm. In some embodiments, a material of the dielectric layers 104 may be molding compound, polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), a combination thereof or the like. In some embodiments, the dielectric layers 104 made of molding compound and the dielectric layers 104 made of polymer (which is not molding compound) may be alternately disposed. In some embodiments, the bottommost dielectric layer 104 is made of molding compound, and the topmost dielectric layer 104 is made of polymer (which is not molding compound), for example. In the exemplary embodiment, the dielectric layers 104 made of polyimide and the dielectric layers 104 made of molding compound may be alternately disposed, in which the bottommost dielectric layer 104 is made of molding compound, and the topmost dielectric layer 104 is made of polyimide. However, the disclosure is not limited thereto.

After forming the redistribution layer structure RDL1, a plurality of bonding elements 106 are formed on the outermost conductive patterns 102a. In some embodiments, the bonding elements 106 may be solder regions such as solder balls or ball grid array (BGA) connectors, metal pillars, and/or the like. The bonding elements 106 are electrically connected to the redistribution layer structure RDL1 through the outermost conductive patterns 102a. In some embodiments, the bonding elements 106 may be formed by a mounting process and a reflow process, for example. In some embodiments, a diameter of the bonding element 106 is in a range of 25 um to 800 um, for example.

Figure 1B:
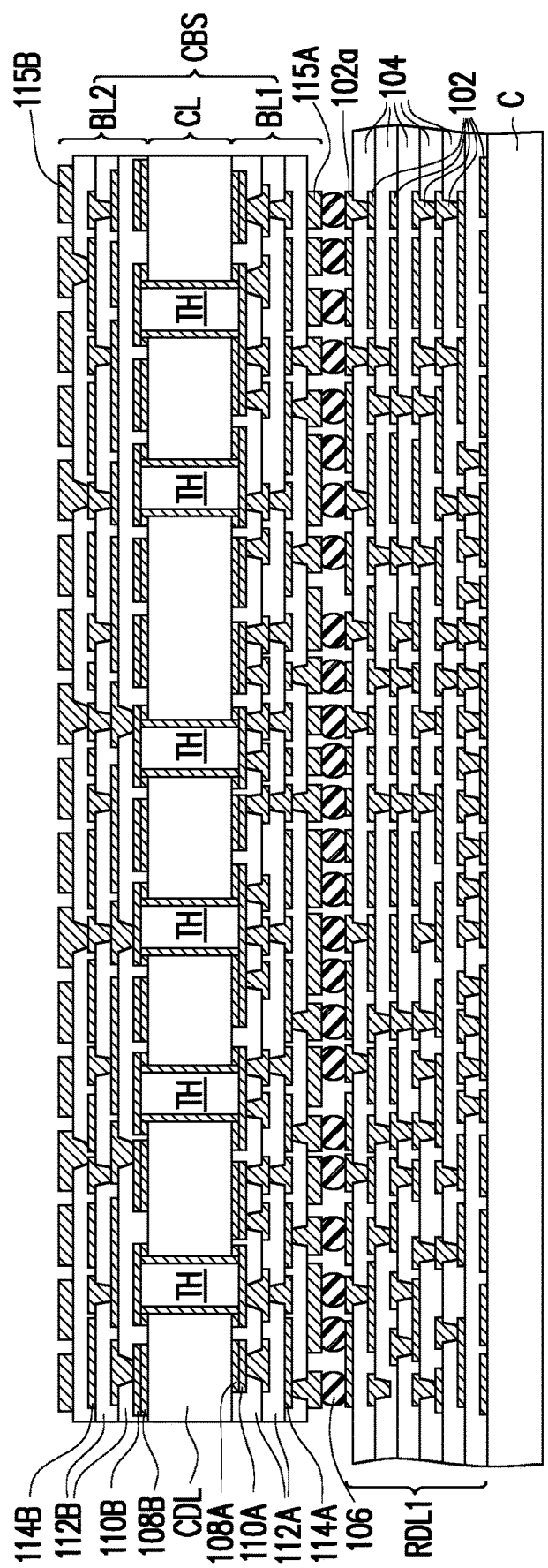

Referring to FIG. 1B, a circuit board structure CBS is bonded to the redistribution layer structure RDL1 through the bonding elements 106. In some embodiments, although only one circuit board structure CBS is shown, a plurality of circuit board structures CBS may be bonded onto the redistribution layer structure RDL1 respectively. In detail, the redistribution layer structure RDL1 may include a plurality of package regions, and the circuit board structures CBS are respectively bonded to the package regions. In some embodiments, the circuit board structure CBS includes a core layer CL and first and second build-up layers BL1, BL2 respectively located on two surfaces of the core layer CL. In some embodiments, the core layer CL includes a core dielectric layer CDL, core conductive layers 108A and 108B, conductive lids 110A and 110B, and plated through holes TH. In some embodiments, the core dielectric layer CDL includes prepreg (which contains epoxy, resin, silica filler and/or glass fiber), Ajinomoto Buildup Film (ABF), resin coated copper foil (RCC), polyimide, photo image dielectric (PID), ceramic core, glass core, molding compound, a combination thereof, or the like. However, the disclosure is not limited thereto, and other dielectric materials may also be used. The core dielectric layer CDL may be formed by a lamination process, a coating process, or the like. The core conductive layers 108A and 108B are formed on the opposite sides of the core dielectric layer CDL. In some embodiments, the core conductive layers 108A and 108B include copper, gold, tungsten, aluminum, silver, gold, a combination thereof, or the like. The conductive lids 110A and 110B are located respectively over the core conductive layers 108A and 108B. In some embodiments, the conductive lids 110A and 110B include copper or other suitable conductive material, for example.

In some embodiments, the plated through holes TH are disposed in and penetrate through the core dielectric layer CDL, which provide electrical connection between the core conductive layer 108A and the core conductive layer 108B. In other words, the plated through holes TH provide electrical paths between the electrical circuits located on two opposing sides of the core dielectric material layer CDL. In some embodiments, the plated through holes TH may be lined with a conductive material and filled up with an insulating material. In some embodiments, the method of forming the plated through holes TH includes the following operations. First, through holes (not shown) are formed at the predetermined positions by, for example, a mechanical or laser drilling, an etching, or another suitable removal technique. A desmear treatment may be performed to remove residues remaining in the through holes. Subsequently, the through holes may be plated with one or more conductive materials to a predetermined thickness, thereby providing the plated through holes TH. For example, the through holes may be plated with copper with an electroplating or an electroless plating.

In some embodiments, the core conductive layers 108A and 108B, the conductive lids 110A and 110B, and the plated through holes TH may be formed by the following steps. First, first conductive material (not shown) is respectively formed on two opposite surfaces of the core dielectric layer CDL. Then, the plated through holes TH are formed to penetrate the core dielectric layer CDL as mentioned before and provide electrical connection between the first conductive material respectively formed on both surfaces of the core dielectric layer CDL. Thereafter, second conductive material is respectively formed over the first conductive materials on the opposite surfaces of the core dielectric layer CDL, where the second conductive material may be different from the first conductive material. In some embodiments, the first and second conductive materials may be formed by using any suitable method (e.g., chemical vapor deposition (CVD) sputtering, printing, plating, or the like). Then, the first conductive materials and the second conductive materials may be patterned together to form the core conductive layers 108A and 108B and the conductive lids 110A and 110B respectively. In some embodiments, the first and second conductive materials may be partially removed using a photolithography and etching process or another suitable removal technique.

In some embodiments, the first and second build-up layers BL1 and BL2 are respectively disposed on the opposite sides of the core layer CL. Specifically, the first build-up layer BL1 is formed over the core conductive layer 108A of the core layer CL, and the second build-up layer BL2 is formed over the core conductive layer 108B of the core layer CL. In some embodiment, the formation of the first build-up layer BL1 may include sequentially forming a plurality of first dielectric layers 112A and a plurality of first conductive patterns 114A, 115A, where the first dielectric layers 112A and the first conductive patterns 114A, 115A are alternately stacked over the first surface of the core layer CL. Similarly, the formation of the second build-up layer BL2 may include sequentially forming a plurality of second dielectric layers 112B and a plurality of second conductive patterns 114B, 115B, where the second dielectric layers 112B and the second conductive patterns 114B, 115B are alternately stacked over the second surface of the core layer CL. In some embodiments, a material of the dielectric layers 112A, 112B may be ABF, prepreg, RCC, polyimide, PID, molding compound, a combination thereof, or the like. In some alternative embodiments, the core dielectric layer CDL and the first and second dielectric layers 112A, 112B may be made of the same material. For example, the material of the core dielectric layer CDL and the first and second dielectric layers 112A, 112B may be molding compound such as epoxy molding compound (EMC). The dielectric layers 112A, 112B may be formed by a lamination process, a coating process, or the like. Although only three layers of conductive patterns and three layers of dielectric layers are illustrated for each of the first build-up layer BL1 and the second build-up layer BL2, the scope of the disclosure is not limited thereto. In other embodiments, the number of dielectric layers (112A/112B) and the number of the conductive patterns (114A/114B/115A/115B) may be adjusted upon the design requirements. In some embodiments, a thickness of the core layer CL is in a range of 30 μm to 2000 μm, for example. In some embodiments, a thickness of the dielectric layer 112A, 112B is in a range of 5 μm to 50 μm, and a thickness of the conductive pattern 114A, 114B, 115A, 115B is in a range of 2 μm to 50 μm, for example. In some embodiments, a thickness of the outermost conductive patterns 115A, 115B may be larger than a thickness of inner conductive patterns 114A, 114B, for example. In some embodiments, the total number of layers of the first build-up layer BL1 may sum up to a total of 0 to 8 layers for the conductive patterns and dielectric layers, and the total number of layers of the second build-up layer BL2 may sum up to a total of 0 to 8 layers for the conductive patterns and dielectric layers. In other words, in some alternative embodiments, at least one of the first build-up layer BL1 and the second build-up layer BL2 may be omitted. In some alternative embodiments, the first build-up layer BL1 may be omitted, and the core layer CL may be bonded to the redistribution layer structure RDL1 through the bonding elements 106. In some embodiments, the number of layers in the first build-up layer BL1 is equal to the number of layers in the second build-up layer BL2. Alternatively, in some embodiments, the total number of the first build-up layer BL1 and the second build-up layer BL2 may be different. In some embodiments, the total number of layers of the first build-up layer BL1 and the second build-up layer BL2 in the circuit board structure CBS is less than the total number of layers of the build-up layer in the conventional circuit board structure, which may be 28 to 36 layers. Therefore, the circuit board structure CBS may be also called a semi-finished circuit substrate or a semi-finished circuit carrier in some examples.

In some embodiments, the outermost conductive patterns 115A of the first build-up layer BL1 are bonded to the bonding elements 106, so that the circuit board structure CBS and the redistribution layer structure RDL1 are bonded. In some embodiments, a reflow process is performed to attach the circuit board structure CBS onto the bonding elements 106 over the redistribution layer structure RDL1, for example. After bonding, the circuit board structure CBS is electrically connected to the redistribution layer structure RDL1 through the bonding elements 106.

Figure 1C:
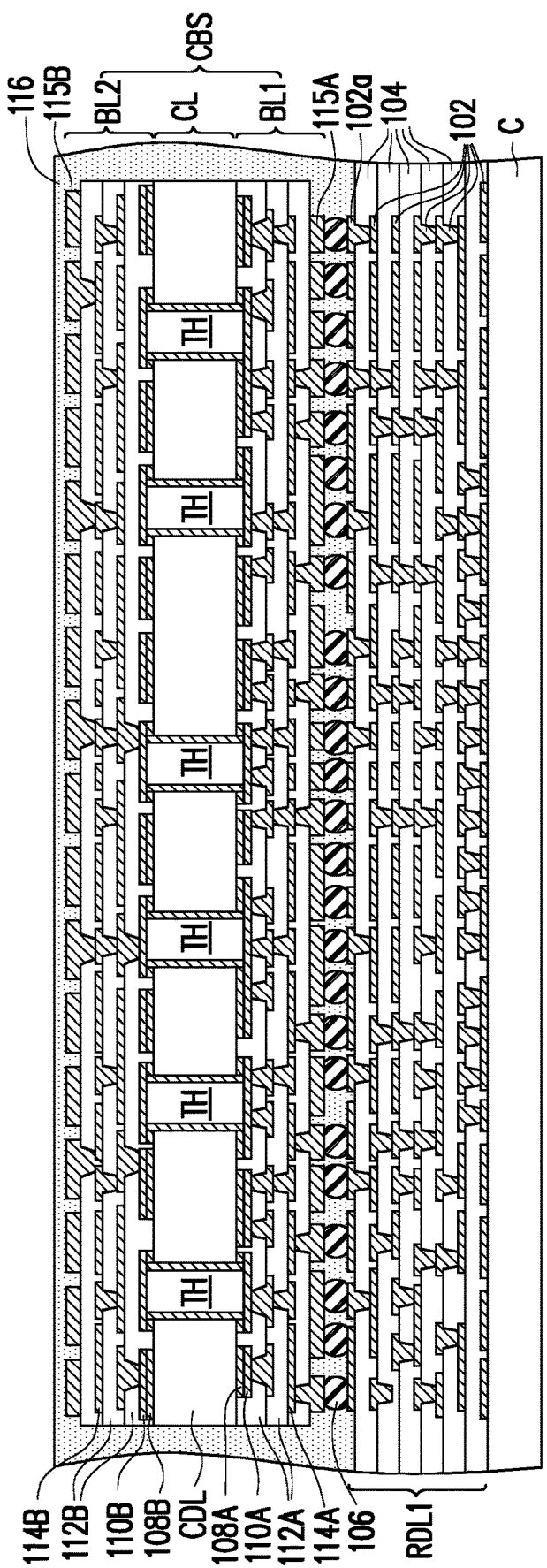

Referring to FIG. 1C, after the circuit board structure CBS and the redistribution layer structure RDL1 are bonded, an insulating material 116 is formed over the carrier C to encapsulate the circuit board structure CBS. In some embodiments, the insulating material 116 may be molding compound, molded underfill, polymer such as polyimide, polybenzoxazole (PBO) or benzocyclobutene (BCB), Ajinomoto Buildup Film (ABF) or other suitable encapsulating materials, for example. In some embodiments, the insulating material 116 may be formed by a molding process or other suitable methods. In the exemplary embodiment, the insulating material 116 is formed by an over-molding process. In some embodiments, the insulating material 116 covers the outermost conductive patterns 115B of the second build-up layer BL2 and a sidewall of the circuit board structure CBS. In addition, the insulating material 116 is formed between the outermost conductive patterns 115A of the first build-up layer BL1 and formed aside the bonding elements 106 and the outermost conductive patterns 102a. In other words, the circuit board structure CBS is embedded in the insulating material 116.

Figure 1D:
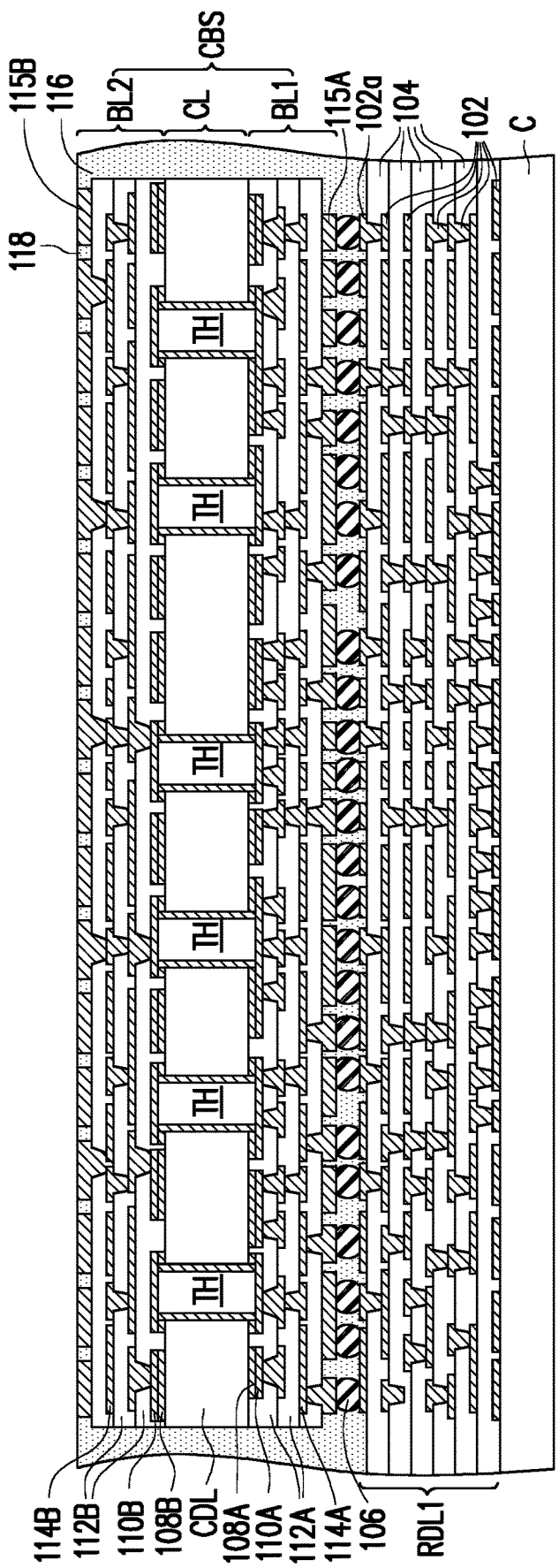

Referring to FIG. 1D, portions of the insulating material 116 are removed, so as to expose the outermost conductive patterns 115B of the second build-up layer BL2 and form insulating patterns 118 between the outermost conductive patterns 115B. In some embodiments, top portions of the insulating material 116 may be partially removed by a grinding process or a planarization process such as a chemical mechanical polishing process until the outermost conductive patterns 115B are exposed. In some embodiments, after grinding, a top surface of the remaining insulating material 116 is substantially flush with a top surface of the circuit board structure CBS. That is, the top surfaces of the insulating patterns 118 are substantially coplanar with the top surfaces of the outermost conductive patterns 115B. Thus, the top surfaces of the outermost conductive patterns 115B are not covered by the insulating patterns 118. In some embodiments, sidewalls of the outermost conductive patterns 115B may be in contact with the insulating patterns 118, for example. In some embodiments, the insulating patterns 118 may be insulating pillars, for example. A thickness of the insulating pattern 118 may be in a range of 7 μm to 80 μm, and a width of the insulating pattern 118 may be in a range of 5 um to 5000 um, for example.

Figure 1E:
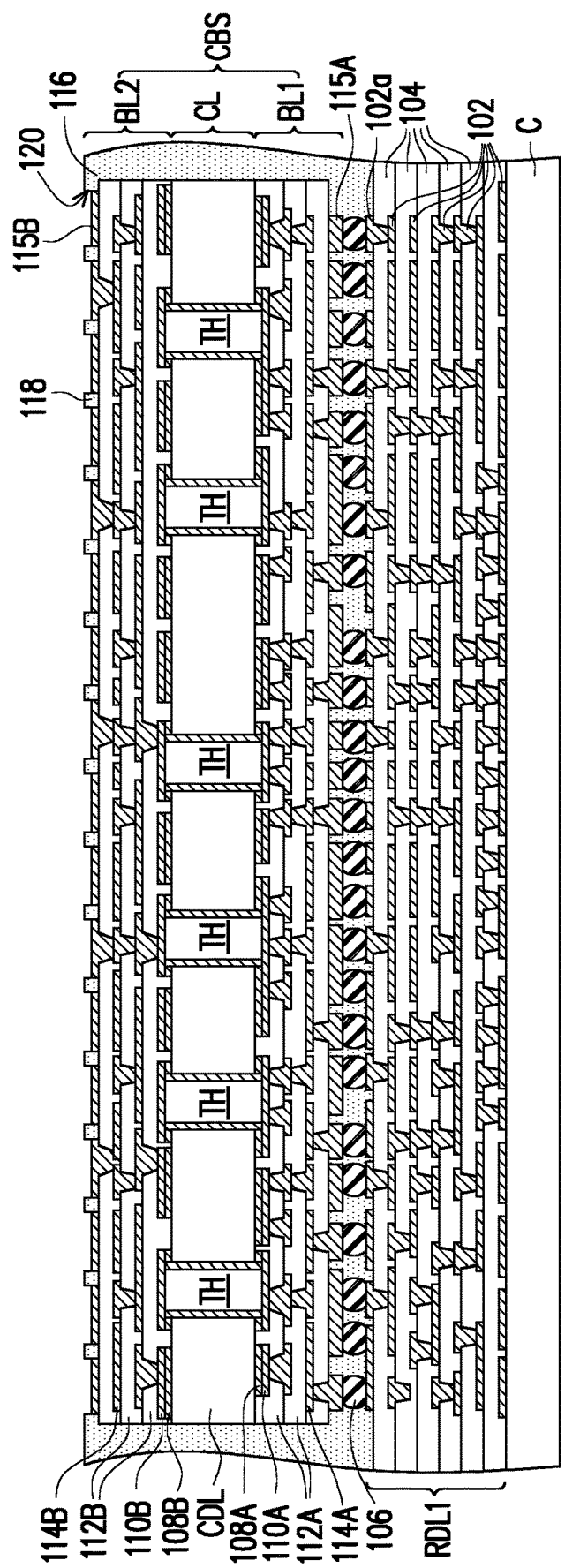

Referring to FIG. 1E, portions of the outermost conductive patterns 115B are removed, and the top surfaces of the outermost conductive patterns 115B are lower than the top surfaces of the insulating patterns 118. In some embodiments, the outermost conductive patterns 115B may be partially removed by an etching process such as a soft etching process. In addition, after the etching process, a surface treatment such as an organic solderability preservative (OSP) surface treatment may be performed on the top surfaces of the outermost conductive patterns 115B, for example. In some embodiments, after partially removed, a thickness of the outermost conductive pattern 115B may be in a range of 5 μm to 30 μm, for example. In some embodiments, as shown in FIG. 1E, an opening 120 is formed among the adjacent insulating patterns 118 and the outermost conductive pattern 115B therebetween, and the opening 120 exposes the outermost conductive pattern 115B. In some examples, the opening 120 may be also called a housing space or a recess for conductive terminal. In some embodiments, the opening 120 may have a depth (i.e., a height difference between the outermost conductive pattern 115B and the insulating pattern 118) in a range of 2 to 50 μm, and a width in a range of 400 μm to 700 μm, for example.

Figure 1F:
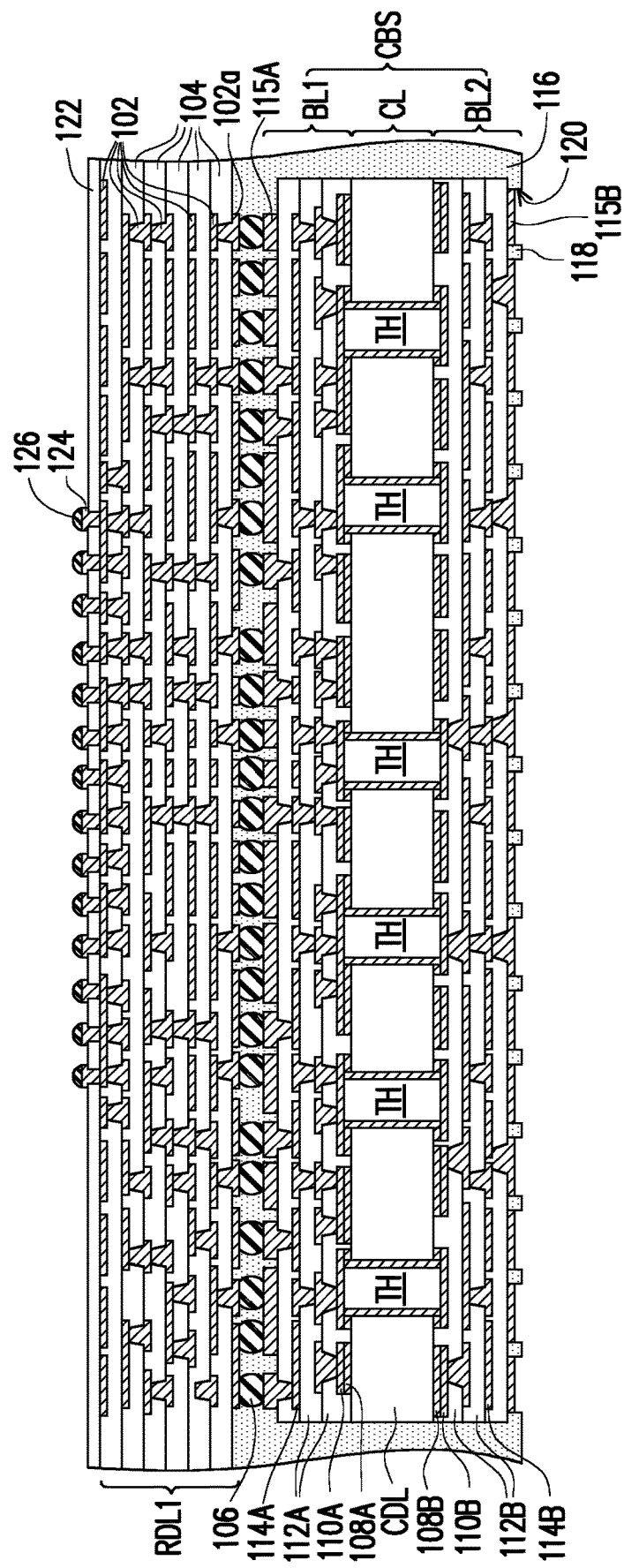

Referring to FIG. 1F, the redistribution layer structure RDL1 with the circuit board structure CBS thereover is de-bonded from the carrier C and is turned upside down. That is, the carrier C is removed. Then, a plurality of bonding elements 126 are formed over the redistribution layer structure RDL1. In some embodiments, before forming the bonding elements 126, a dielectric layer 122 is formed on the redistribution layer structure RDL1, and a plurality of conductive patterns 124 are formed in the dielectric layer 122 to electrically connect the redistribution layer structure RDL1. In some embodiments, the dielectric layer 122 is formed on and exposes the outermost conductive patterns 102a of the redistribution layer structure RDL1. In some embodiments, a material of the dielectric layer 122 may be polymer such as polyimide, polybenzoxazole (PBO) or benzocyclobutene (BCB), nitride such as silicon nitride, oxide such as silicon oxide, phosphosilicate glass (PSG), borosilicate glass (BSG), boron-doped phosphosilicate glass (BPSG), a combination thereof or the like. In some embodiments, the dielectric layer 122 may be formed by suitable fabrication techniques such as spin-on coating, chemical vapor deposition (CVD), plasma-enhanced chemical vapor deposition (PECVD) or the like. In some embodiments, the material of the dielectric layer 122 may be different from the material of the outermost dielectric layer 104 of the redistribution layer structure RDL1, for example. In the exemplary embodiment, the outermost dielectric layer 104 may be made of molding compound, and the dielectric layer 122 may be made of polymer such as polyimide. However, the disclosure is not limited thereto. In some embodiments, the conductive patterns 124 are used as conductive terminals, which may include a plurality of conductive pillars and a plurality of under-ball metallurgy (UBM) patterns thereebeneath for ball mount. In some embodiments, the redistribution layer structure RDL1 and the dielectric layer 122 and the conductive patterns 124 over the redistribution layer structure RDL1 may be collectively referred to as a redistribution layer structure over the circuit board structure CBS.

After forming the conductive patterns 124 in the dielectric layer 122, the bonding elements 126 are formed on and electrically connected to the conductive patterns 124. In some embodiments, the bonding elements 126 may be solder regions such as micro-bumps or the like. The bonding elements 126 are electrically connected to the redistribution layer structure RDL1 through the conductive patterns 124. In some embodiments, the bonding elements 126 may be formed by a mounting process and a reflow process, for example. In some embodiments, a diameter of the bonding element 126 is smaller than a diameter of the bonding elements 106. In some embodiments, the pitch between the bonding elements 126 may be 20 μm to 80 μm, and the diameter of the bonding elements 126 may be between 10 μm to 25 μm, for example. During the formation of the conductive patterns 124 and the bonding elements 126, the outermost conductive patterns 115B of the circuit board structure CBS may be protected from being damaged.

Figure 1G:
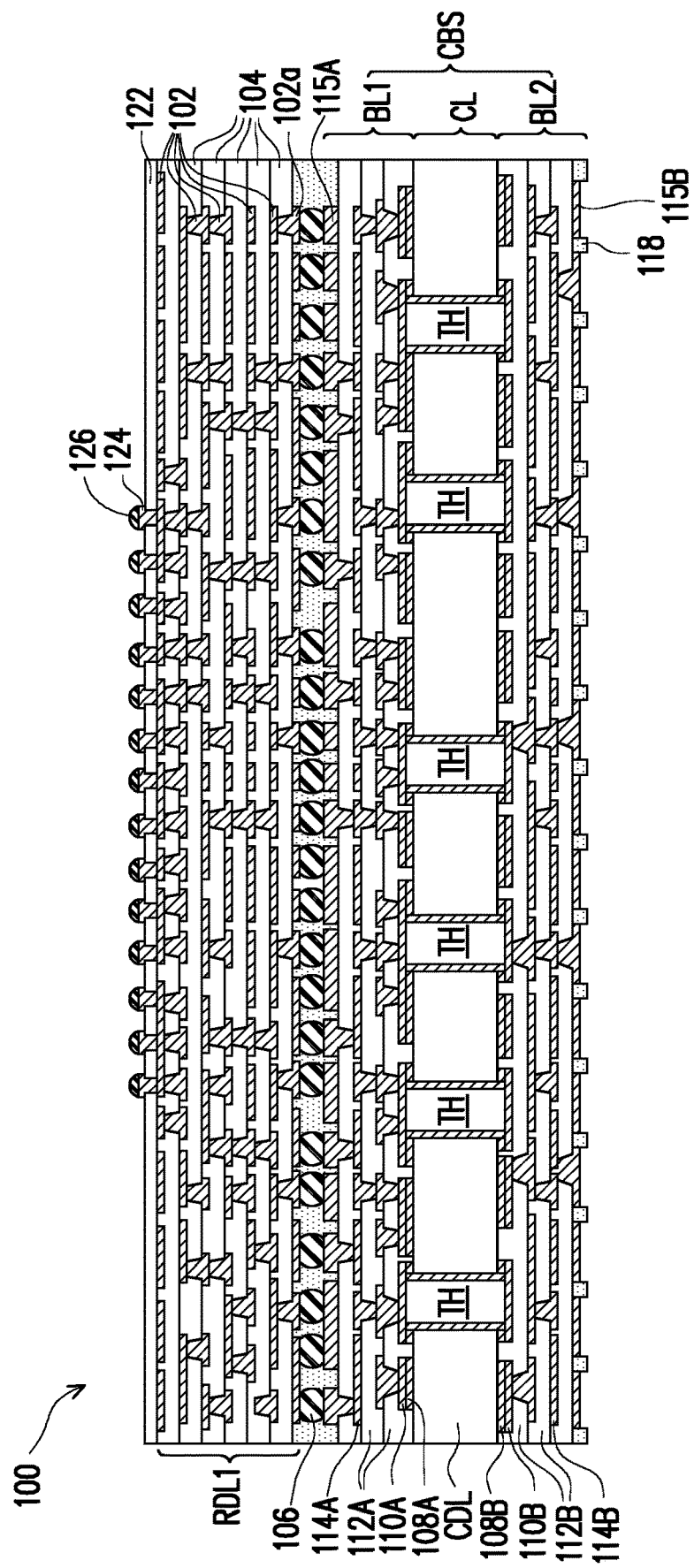

Referring to FIG. 1G, in some embodiments, a dicing process is performed to cut the whole structure (at least cutting though the redistribution layer structure RDL1 and the dielectric layer 122) along a cutting line into individual and separated integrated substrates 100 for semiconductor package, as shown in FIG. 1G. In some embodiments, the cutting line is substantially an extension line of a sidewall of the circuit board structure CBS, for example. In some embodiments, the dicing process is a wafer dicing process including mechanical blade sawing or laser cutting. In some embodiments, the integrated substrate 100 for package structure may include the circuit board structure CBS (i.e., a semi-finished circuit substrate), the redistribution layer structure (i.e., the redistribution layer structure RDL1, the conductive patterns 124, and the dielectric layer 122) and the insulating patterns 118 on opposite surfaces of circuit board structure CBS, and the bonding elements 106, 126 on opposite surfaces of the redistribution layer structure. In some embodiments, the integrated substrate 100 has a high modulus such as in a range of 15 GPa to 50 GPa, for example.

Figure 1H:
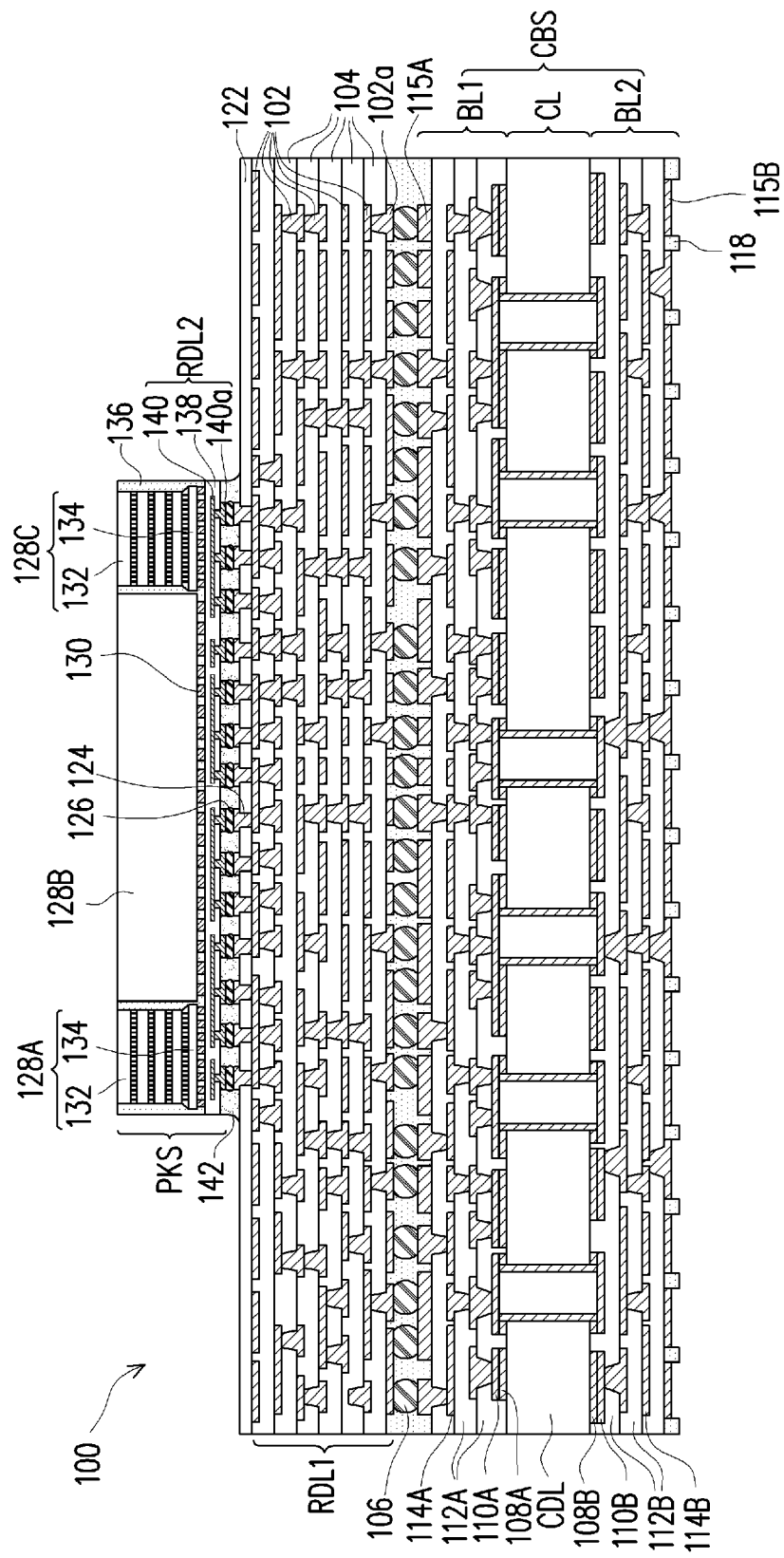

Referring to FIG. 1H, a semiconductor package PKS is bonded to the integrated substrate 100 through the bonding elements 126. In some embodiments, the package structure PKS may include System-On-Chip (SoC) packages, Chip-On-Wafer (CoW) packages, Integrated-Fan-Out (InFO) packages, Chip-On-Wafer-On-Substrate (CoWoS) packages, other three-dimensional integrated circuit (3DIC) packages, and/or the like. In some embodiments, the semiconductor package PKS includes a plurality of package components 128A, 128B, 128C with a plurality of connectors 130 thereon, an encapsulant 136 encapsulating the package components 128A, 128B, 128C, and a redistribution layer structure RDL2 over the encapsulant 136.

In some embodiments, each of the package components 128A, 128B, 128C may be a package, a device die, a die stack, and/or the like. The device die may be high performance integrated circuit, such as a System-on-Chip (SoC) die, a Central Processing Unit (CPU) die, a Graphic Processing Unit (GPU) die, field-programmable gate array (FPGA) die, a mobile application die, a memory die, or a die stack. In some embodiments, the memory die may be in the form of memory cube such as High Bandwidth Memory (HBM) cube. The package components 128A, 128B, 128C may have the respective semiconductor substrates (not shown) in the respective dies. In some embodiments, a rear surface of the semiconductor substrates is a surface that faces upward in accordance to the orientation illustrated in FIG. 1H. The package components 128A, 128B, 128C further include integrated circuit devices (such as active devices, which include transistors, for example, not shown) at a front surface (e.g., a surface facing downward) of the respective semiconductor substrates. In some embodiments, the package components 128A, 128B, 128C may have the same or different sizes and/or functions upon the design requirements. In one of the exemplary embodiments, the package components 128A, 128C may be memory cubes, and the package component 128B may be CPU, GPU, FPGA or other suitable high performance integrated circuit. In the exemplary embodiment, the package component 128A, 128C may include a die stack 132, and a controller 134 at the bottom of the die stack 132.

Figure 1I:
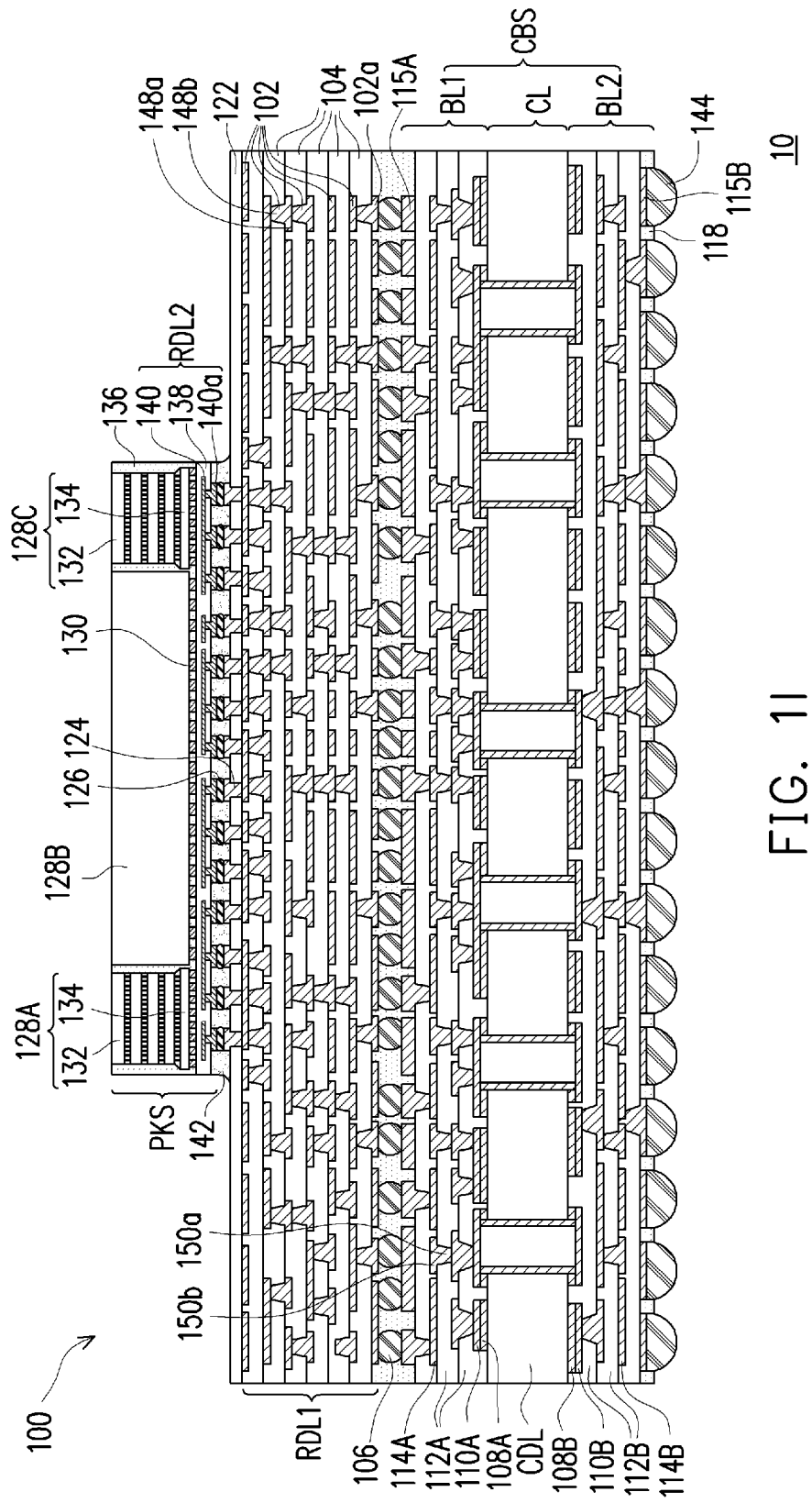

In some embodiments, the connectors 130 of package components 128A, 128B, 128C may be encapsulated in the encapsulant 136 as shown in FIG. 1I. Alternately, the connectors 130 may be disposed in a dielectric layer (not shown) which is then encapsulated by the encapsulant 136. In some embodiments, the redistribution layer structure RDL2 is disposed over the package components 128A, 128B, 128C and the encapsulant 136 and electrically connected to the package components 128A, 128B, 128C. In some embodiments, the redistribution layer structure RDL2 may be a fan-out redistribution layer structure, for example. The redistribution layer structure RDL2 may include a plurality of dielectric layers 138 and a plurality of conductive patterns 140, 140a, and the dielectric layers 138 and the conductive patterns 140, 140a are alternately stacked over the package components 128A, 128B, 128C. In some embodiments, the outermost conductive patterns 140a are used as conductive terminals, which may include a plurality of conductive pillars and a plurality of under-ball metallurgy (UBM) patterns thereebeneath for ball mount. In some embodiments, after bonding, an underfill 142 may be dispensed to protect the bonding structure between the package structure PKS and the redistribution layer structure over the circuit board structure CBS. In some embodiments, a total thickness ranging from a bottom of the underfill 142 to a top of the package structure PKS may be in a range of 50 μm to 1500 µm. In some embodiments, the package structure PKS is pre-fabricated, that is, the package components 128A, 128B, 128C are encapsulated by the encapsulant 136 before bonding to the integrated substrate 100. However, the invention is not limited thereto. In some alternative embodiments, the package components 128A, 128B, 128C may be bonded to the integrated substrate 100, and then the encapsulant 136 is formed over the integrated substrate 100 to encapsulate the package components 128A, 128B, 128C, for example.

Referring to FIG. 1I, after the package structure PKS is formed, a plurality of conductive terminals 144 are formed in the openings 120 exposing the outermost conductive pattern 115B of the second build-up layer BL2. The conductive terminals 144 are electrically connected to the outermost conductive patterns 115B in the second build-up layer BL2 of the circuit board structure CBS. In some embodiments, the conductive terminals 144 may be ball grid array (BGA) connectors, solder balls, metal pillars, and/or the like. In some embodiments, a pitch of the conductive terminals 144 may be in a range from 500 µm to 1500 µm. In some embodiments, the conductive terminals 144 may be formed by a mounting process and a reflow process. In some embodiments, as shown in FIG. 1I, the openings 120 are filled with the conductive terminals 144 and the top surfaces of the insulating patterns 118 are not covered by the conductive terminals 144. However, the disclosure is not limited thereto. In some alternative embodiments, the top surfaces of the insulating patterns 118 may be partially covered by the conductive terminals 144 while the conductive terminals 144 are separated from each other. Alternatively, the conductive terminals 144 does not fully cover the outermost conductive patterns 115B, and a gap may be formed between the conductive terminal 144 and the insulating pattern 118. In certain embodiments, the conductive terminals 144 are available to be mounted onto additional electrical components (e.g., circuit carrier, system board, mother board, etc.).

At this point, a semiconductor package 10 is fabricated. In some embodiments, the semiconductor package 10 may have a super large size equal to 70 mm×70 mm or 100 mm×100 mm or larger. In some embodiments, the semiconductor package 10 includes the circuit board structure CBS, the redistribution layer structure RDL1, the conductive patterns 124 in the dielectric layer 122, and the package structure PKS including the redistribution layer structure RDL2. In some embodiments, the redistribution layer structure RDL1 is formed first, and then the circuit board structure CBS and the package structure PKS are bonded to opposite sides of the redistribution layer structure RDL1. Therefore, as shown in FIG. 1I, the configuration of the conductive patterns 102/102a of the redistribution layer structure RDL1 is different from the configuration of the conductive patterns 114A/115A of the first build-up layer BL1 and the adjacent conductive patterns 124. In detail, some of the conductive patterns 102/102a may have a first portion 148a and a second portion 148b integrally formed, the first portion 148a is disposed between the second portion 148b and the circuit board structure CBS, and the second portion 148b is disposed between the first portion 148a and the package structure PKG. In some embodiments, the first portion 148a may be a line, and the second portion 148b may be a via, for example. In some embodiments, a width of the second portion 148b is less than a width of the first portion 148a. In some embodiments, a width of the conductive pattern 102/102a may be gradually decreased along a direction D from the circuit board structure CBS to the package structure PKG. In other words, the conductive pattern 102/102a may have a hat-like cross-section, for example.

In some embodiments, some of the conductive patterns 114A, 115A, and 124 have a first portion 150a and a second portion 150b integrally formed, the first portion 150a is disposed between the second portion 150b and the circuit board structure CBS, and the second portion 150b is disposed between the first portion 150a and the package structure PKG. In some embodiments, the first portion 150a may be a line, and the second portion 150b may be a via, for example. In some embodiments, a width of the second portion 150b is larger than a width of the first portion 150a. In other words, a width of the conductive pattern 114A, 115A, 124 may be gradually increased along the direction D from the circuit board structure CBS to the package structure PKG. In some embodiments, the conductive pattern 114A, 115A, and 124 have a screw-like cross-section. In other words, the conductive patterns 102/102a of the redistribution layer structure RDL1 and the conductive patterns 114A, 115A, and 124 adjacent thereto may have inverted profile.

In order to bond the circuit board structure CBS and the package structure PKS to the redistribution layer structure RDL1 respectively, the bonding elements 106 and 126 are disposed on opposite sides of the redistribution layer structure RDL1. In detail, the bonding element 106 is disposed between and electrically connected to the redistribution layer structure RDL1 and the circuit board structure CBS, and the bonding element 126 is disposed between and electrically connected to the redistribution layer structure RDL1 and the package structure PKS. In some embodiments, a diameter of each bonding element 126 is less than a diameter of each bonding element 106, and a diameter of each bonding element 106 is less than a diameter of each conductive terminal 144.

Figure 2:
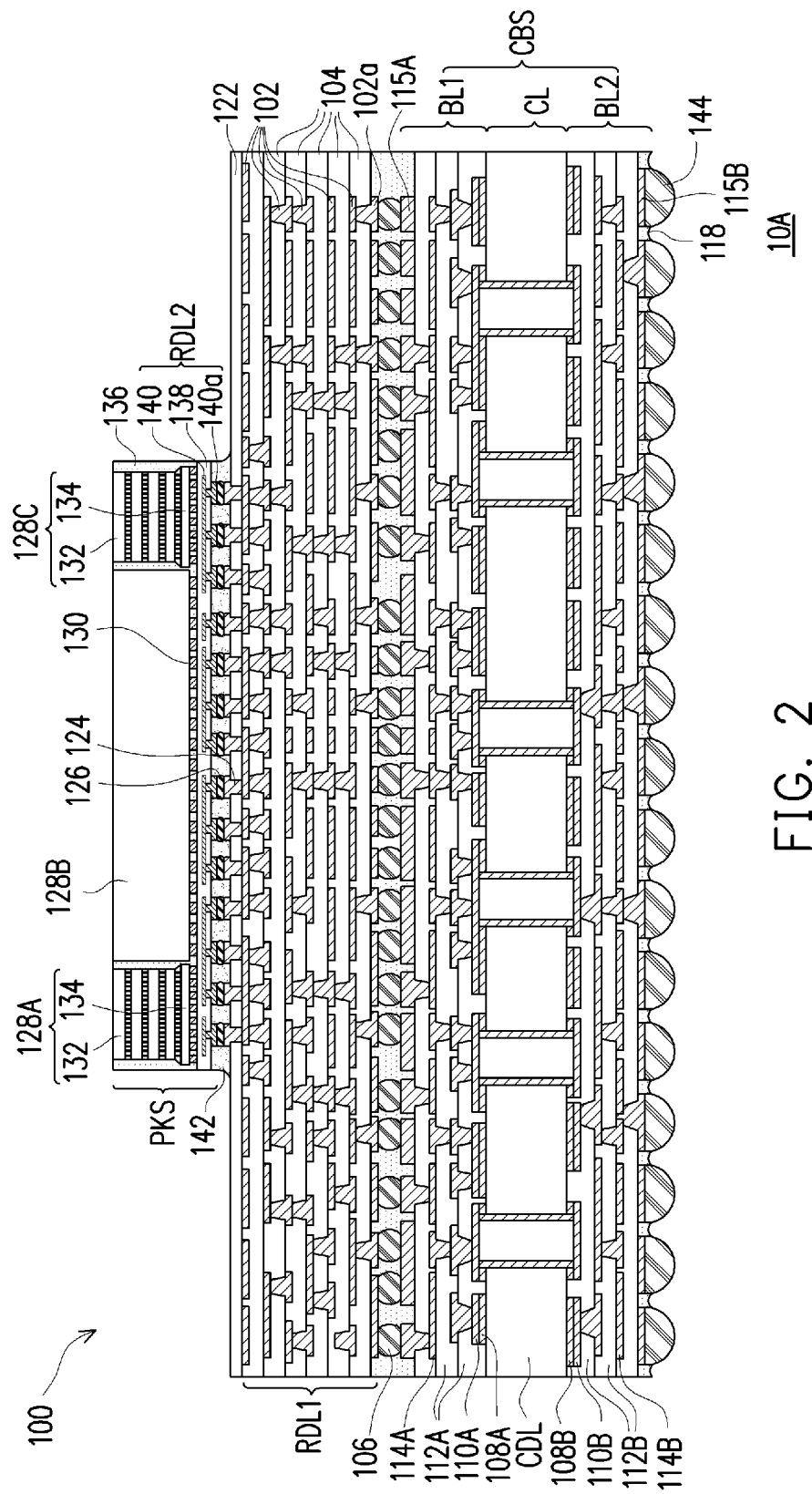
FIG. 2 is a schematic cross-sectional view illustrating a semiconductor package in accordance with some embodiments of the disclosure.

In some embodiments, as mentioned before, the insulating material 116 may be formed by an over-molding process. However, the invention is not limited thereto. In some alternative embodiments, the insulating material 116 may be formed by a mould with a release film pressed against the top surfaces of the outermost conductive patterns 115B, and the insulating patterns 118 may be formed directly after removing the mould and the release film. In other words, the insulating patterns 118 may be formed without a grinding process, and as shown in the semiconductor package 10A of FIG. 2, the top surfaces of the insulating patterns 118 may be dished due to the release film, for example.

Figure 3:
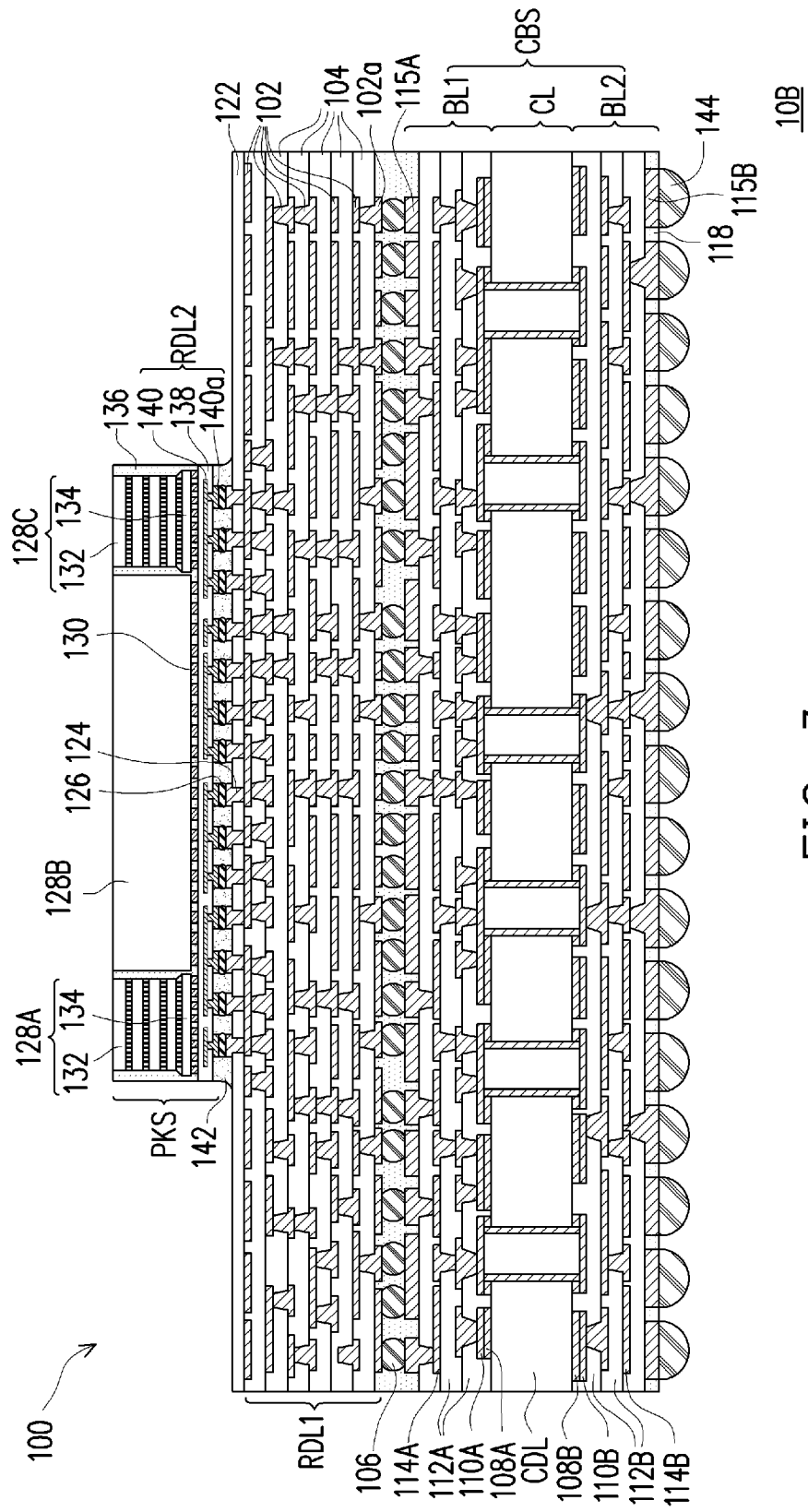
FIG. 3 is a schematic cross-sectional view illustrating a semiconductor package in accordance with some embodiments of the disclosure.

FIG. 3 is a schematic sectional view of a semiconductor package according to some exemplary embodiments of the present disclosure. The semiconductor package 10B illustrated in FIG. 3 is similar to the semiconductor package 10 illustrated in FIG. 1I, hence the same reference numerals are used to refer to the same and liked parts, and its detailed description will be omitted herein. The difference between the semiconductor package 10 and the semiconductor package 10B is in the design of insulating patterns 118 and the conductive patterns 115B therebetween. For example, in the embodiment shown in FIG. 1I, the outermost surfaces of the conductive patterns 115B are recessed from or relative to the outermost surfaces of the insulating patterns 118. However, in the embodiment shown in FIG. 3, the outermost surfaces of the conductive patterns 115B are substantially flush with the outermost surfaces of the insulating patterns 118, and the outermost surfaces of the conductive patterns 115B are not covered by the insulating patterns 118. In other words, a step of partially removing the conductive patterns 115B as shown in FIG. 1E may be omitted, and no openings are formed above the outermost conductive patterns 115B. In some embodiments, the thickness of the conductive patterns 115B may be substantially the same as the initial thickness. Then, the conductive terminals 144 are formed on the top surfaces of the outermost conductive patterns 115B of the second build-up layer BL2.

In some embodiments, the substrate for the package structure includes the semi-finished circuit substrate and the redistribution layer structure. In other words, compared with the conventional circuit board made of the core layer and the build-up layers, the substrate for the package structure further includes the redistribution layer structure, which replaces parts of the build-up layers. In some embodiments, the redistribution layer structure of the substrate may be fabricated by an InFO process in an environment such as standard silicon fabrication environment. Therefore, the substrate may be fabricated with a high yield, and the substrate may have high modulus, reduced thickness, low roughness, and/or good electrical performance. Accordingly, rigidity, inductance and/or resistance of the whole semiconductor package is enhanced and cost is reduced. In addition, the process of the semiconductor package is suitable for system on integrated substrate (SoIS) and system on wafer (SoW), and meets the requirements for high performance computing structures. Furthermore, the insulating patterns defining the openings may be formed of molding compound by a molding process without the need of lithography process, and thus the forming process of the openings for the conductive terminals is simple and cost is low. Accordingly, complexity and cost for fabricating the semiconductor package are reduced, and yield and performance of the semiconductor package are improved.

In accordance with some embodiments of the present disclosure, a semiconductor package includes a circuit board structure, a first redistribution layer structure, a plurality of first bonding elements, a package structure and a plurality of second bonding elements. The first redistribution layer structure is disposed over and electrically connected to the circuit board structure. The first bonding elements are disposed between and electrically connected to the first redistribution layer structure and the circuit board structure. The package structure is disposed over and electrically connected to the first redistribution layer structure. The second bonding elements are disposed between and electrically connected to the first redistribution layer structure and the package structure.

In accordance with alternative embodiments of the present disclosure, a semiconductor package includes a circuit board structure, a package structure, a plurality of insulating patterns and a plurality of conductive terminals. The circuit board structure includes a plurality of outermost conductive patterns. The package structure is disposed over a first side of the circuit board structure. The insulating patterns are disposed over a second side opposite to the first side of the circuit board structure, wherein the outermost conductive patterns and the insulating patterns are alternately disposed, and the outermost conductive patterns are not covered by the insulating patterns. The conductive terminals are respectively disposed on and electrically connected to the outermost conductive patterns.

In accordance with yet alternative embodiments of the present disclosure, a method of manufacturing a semiconductor package includes the following steps. A first redistribution layer structure is formed. A circuit board structure is bonded onto the first redistribution layer structure, wherein the circuit board structure includes a plurality of outermost conductive patterns. An insulating material is formed to encapsulate the circuit board structure, wherein the insulating material includes a plurality of insulating patterns disposed between and exposing the outermost conductive patterns. Portions of the outermost conductive patterns are removed, and top surfaces of the outermost conductive patterns are lower than top surfaces of the insulating patterns. A package structure is bonded onto the first redistribution layer structure. A plurality of conductive terminals are formed on the outermost conductive patterns respectively.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor package, comprising:
a circuit board structure comprising a core layer, a first build-up layer and a second build-up layer on opposite surfaces of the core layer, and a plurality of plated through holes penetrating through the core layer and electrically connecting the first build-up layer and the second build-up layer;
a first redistribution layer structure, electrically connected to the circuit board structure, wherein the first build-up layer is disposed between the core layer and the first redistribution layer structure;
a plurality of first bonding elements, disposed between and electrically connected to the first redistribution layer structure and the circuit board structure;
a package structure, disposed over and electrically connected to the first redistribution layer structure;
an underfill, disposed between the first redistribution layer structure and the circuit board structure and between the first bonding elements, wherein sidewalls of the first redistribution layer structure and the underfill are flush with sidewalls of the core layer, the first build-up layer and the second build-up layer; and
a plurality of second bonding elements, disposed between and electrically connected to the first redistribution layer structure and the package structure.

2. The semiconductor package according to claim 1, wherein the first bonding elements and the second bonding elements are solder regions.

3. The semiconductor package according to claim 1, wherein a diameter of each of the first bonding elements is larger than a diameter of each of the second bonding elements.

4. The semiconductor package according to claim 1, further comprising a plurality of conductive terminals on a surface of the circuit board structure opposite to a surface on which the first redistribution layer structure is disposed, wherein a diameter of each of the conductive terminals is larger than a diameter of each of the first bonding elements.

5. The semiconductor package according to claim 1, wherein the first redistribution layer structure comprises a first via and a first line integrally formed with the first via and having a larger width than the first via, the first build-up layer comprises a second via and a second line integrally formed with the second via and having a larger width than the second via, and the first line and the second line are disposed between the first via and the second via.

6. The semiconductor package according to claim 1, wherein the package structure comprises a plurality of package components and a second redistribution layer structure, and the second redistribution layer structure is disposed between and electrically connected to the package components and the second bonding elements.

7. The semiconductor package according to claim 1, further comprising a plurality of conductive patterns between the second bonding elements and the first redistribution layer structure, wherein the first redistribution layer structure comprises a first via and a first line integrally formed with the first via and having a larger width than the first via, the conductive patterns comprises a second via and a second line integrally formed with the second via and having a larger width than the second via, and the first via and the second via are disposed between the first line and the second line.

8. A semiconductor package, comprising:
a circuit board structure comprising a core layer, a first build-up layer and a second build-up layer on opposite surfaces of the core layer, a plurality of plated through holes penetrating through the core layer and electrically connecting the first build-up layer and the second build-up layer and a plurality of outermost conductive patterns;
a package structure over the first build-up layer;
a plurality of insulating patterns over the second build-up layer, wherein the plurality of outermost conductive patterns and the plurality of insulating patterns are alternately disposed, and the outermost conductive patterns are not overlapped with the insulating patterns; and
a plurality of conductive terminals, respectively disposed on and electrically connected to the outermost conductive patterns.

9. The semiconductor package according to claim 8, wherein an outer surface of one of the outermost conductive patterns is recessed relative to outer surfaces of adjacent insulating patterns.

10. The semiconductor package according to claim 8, wherein top surfaces of the insulating patterns are flush with top surfaces of the outermost conductive patterns.

11. The semiconductor package according to claim 8, wherein top surfaces of the insulating patterns are recessed.

12. The semiconductor package according to claim 8, wherein each of the outermost conductive patterns is in contact with adjacent corresponding insulating patterns.

13. The semiconductor package according to claim 8, further comprising a redistribution layer structure between the circuit board structure and the package structure.

14. The semiconductor package according to claim 8, wherein entire outer surfaces of the outermost conductive patterns are disposed between bottom surfaces and top surfaces of the insulating patterns.

15. The semiconductor package according to claim 8 further comprising an underfill between the package structure and the first build-up layer, wherein a material of the plurality of insulating patterns is the same as a material of the underfill.

16. A method of manufacturing a semiconductor package, comprising:
forming a circuit board structure, the circuit board structure comprising a core layer, a first build-up layer and a second build-up layer on opposite surfaces of the core layer, a plurality of plated through holes penetrating through the core layer and electrically connecting the first build-up layer and the second build-up layer, and a plurality of outermost conductive patterns;
bonding the circuit board structure onto a first redistribution layer structure, wherein the first build-up layer of is disposed between the first redistribution layer structure and the core layer;
forming an insulating material to encapsulate the circuit board structure over the first redistribution layer structure, wherein the insulating material includes a plurality of insulating patterns, the outermost conductive patterns and the insulating patterns are alternately disposed, and the outermost conductive patterns are not overlapped with the insulating patterns;
bonding a package structure onto the first redistribution layer structure; and
forming a plurality of conductive terminals on the outermost conductive patterns respectively.

17. The method according to claim 16, wherein forming the insulating material comprises:
forming the insulating material to encapsulate a sidewall and the top surfaces of the outermost conductive patterns; and
removing portions of the insulating material to form the insulating patterns and expose the top surfaces of the outermost conductive patterns, wherein the top surfaces of the insulating patterns are substantially flush with the top surfaces of the outermost conductive patterns.

18. The method according to claim 16, further comprising removing portions of the outermost conductive patterns, wherein top surfaces of the outermost conductive patterns are lower than top surfaces of the insulating patterns.

19. The method according to claim 16, further comprising cutting the first redistribution layer structure and the insulating material along a sidewall of the circuit board structure.

20. The method according to claim 16, further comprising forming a plurality of bonding elements on the first redistribution layer structure, wherein the circuit board structure is bonded onto the first redistribution layer structure through the bonding elements.

* * * * *